US008581628B2

(12) United States Patent
Yeh et al.

(10) Patent No.: US 8,581,628 B2
(45) Date of Patent: Nov. 12, 2013

(54) LOW VOLTAGE TRANSMITTER WITH HIGH OUTPUT VOLTAGE

(75) Inventors: Chun-Wen Yeh, Hsinchu Hsien (TW); Hsian-Feng Liu, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 183 days.

(21) Appl. No.: 13/074,173

(22) Filed: Mar. 29, 2011

(65) Prior Publication Data

US 2012/0057262 A1 Mar. 8, 2012

(30) Foreign Application Priority Data

Sep. 8, 2010 (TW) ............................... 99130320 A

(51) Int. Cl.
*H03K 19/0175* (2006.01)

(52) U.S. Cl.
USPC ................. 326/82; 326/30; 326/86; 326/115; 327/109

(58) Field of Classification Search
USPC ........... 326/30, 80–83, 86–87, 112–113, 115; 327/108–109, 112, 333
See application file for complete search history.

(56) References Cited

U.S. PATENT DOCUMENTS

| | | | | |
|---|---|---|---|---|
| 5,821,800 | A * | 10/1998 | Le et al. | 327/333 |
| 7,068,074 | B2 * | 6/2006 | Bhattacharya et al. | 326/63 |
| 7,256,625 | B2 * | 8/2007 | Liu et al. | 327/112 |
| 7,279,937 | B2 * | 10/2007 | Aliahmad et al. | 326/115 |
| 7,336,780 | B2 * | 2/2008 | Lim et al. | 379/388.06 |
| 7,358,772 | B1 * | 4/2008 | Chen et al. | 326/83 |
| 7,538,588 | B2 * | 5/2009 | Liu et al. | 327/108 |
| 7,768,308 | B2 * | 8/2010 | Maede et al. | 326/68 |
| 7,884,646 | B1 * | 2/2011 | Bourstein | 326/81 |
| 2003/0085736 | A1 * | 5/2003 | Tinsley et al. | 326/81 |
| 2004/0041593 | A1 * | 3/2004 | Lai | 326/115 |
| 2009/0174439 | A1 * | 7/2009 | Luo et al. | 327/108 |
| 2010/0141296 | A1 * | 6/2010 | Wood et al. | 326/11 |

* cited by examiner

*Primary Examiner* — Jason M Crawford
(74) *Attorney, Agent, or Firm* — Han IP Corporation

(57) ABSTRACT

A transmitter comprises a protection circuit; a first termination resistor having a first end coupled to a first voltage source, and a second end coupled to the protection circuit; a second termination resistor having a first end coupled to the first voltage source, and a second end coupled to the protection circuit, wherein the second end of the first termination resistor and the second end of the second termination resistor form a differential output pair; a current switch coupled to the protection circuit; a current source coupled to the current switch; and a pre-driver circuit coupled to the current switch, for controlling the current switch, making the differential output pair generate an output current. Wherein, the pre-driver circuit receives a second voltage source, and the first voltage source is higher than the second voltage source.

7 Claims, 5 Drawing Sheets

LOW VOLTAGE TRANSMITTER WITH HIGH OUTPUT VOLTAGE

CROSS REFERENCE TO RELATED PATENT APPLICATIONS

This patent application claims priority from Taiwan Patent Application No. 099130320, filed in the Taiwan Patent Office on Sep. 8, 2010, entitled "Low Voltage Transmitter with High Output Voltage", and incorporates the Taiwan patent application in its entirety by reference.

TECHNICAL FIELD

The present disclosure relates to a transmitter, and more particularly to a low-voltage (LV) transmitter with a high output voltage.

BACKGROUND OF THE PRESENT DISCLOSURE

It's widely known that a transceiver with a high-speed serial interface, e.g., high definition interface (HDMI), display port interface, or universal serial bus (USB) interface, is capable of increasing data transmission rates.

Take HDMI specification for example. A transmitter needs to generate a small voltage swing signal that varies between a high voltage 3.3V and a low voltage 2.8V on a termination resistor of a receiver.

Generally, in order to process data rapidly, control circuits of the transmitter are supplied by a low-voltage (LV) source (e.g., 1.2V or substantially 1.2V) and are operated at a low voltage. In order to generate a high output voltage (e.g., 3.3V or substantially 3.3V) at an output end of the transmitter, a level shifter is provided to convert an LV digital signal to a high-voltage (HV) digital signal, which is then implemented for generating a high output voltage of the transmitter.

FIG. 1 is a schematic diagram of a transmitter and a receiver of the prior art. Resistors Rt1 and Rt2 are termination resistors of a transmitter 100 and resistors Rr1 and Rr2 are termination resistors of a receiver 160—such a structure is a double-terminal architecture for high-speed serial interfaces.

The transmitter 100 comprises an N-to-1 serializer 110 and a pre-driver circuit 120, a current switch 130, a current source Is, and the termination resistors Rt1 and Rt2. The current switch 130 comprises a first transistor M1 and a second transistor M2, which are n-type field effect transistors (FETs).

One end of the termination resistors Rt1 and Rt2 are connected to a high voltage source Vdd1, e.g., 3.3V, and the other end the termination resistors Rt1 and Rt2, nodes d1 and d2 respectively, are regarded as a differential output pair of the transmitter 100. The first transistor M1 and the second transistor M2 have drains respectively connected to the nodes d1 and d2, and sources connected to one end of the current source Is; the other end of the current source Is is connected to the ground. The current source Is provides an appropriate bias voltage to the current switch 130, such that small voltage swing signals of the differential output pair d1 and d2 conform to a predetermined specification.

The N-to-1 serializer 110 receives and converts N parallel bits to a serial signal. The pre-driver circuit 120 receives the serial signal and generates a first control signal and a second control signal to gates of the first transistor M1 and the second transistor M2.

The receiver 160 comprises the termination resistors Rr1 and Rr2. One end of the termination resistors Rr1 and Rr2 are connected to the high voltage source Vdd1, e.g., 3.3V, and the other end of the termination resistors Rr1 and Rr2, nodes d3 and d4 respectively, are regarded as a differential input pair of the receiver 160. The differential output pair d1 and d2 of the transmitter 100 connects to the differential input pair d3 and d4 via transmission lines 150.

When the transmitter 100 is under operation, the N-to-1 serializer 110 receives and converts N bits to a serial signal. The pre-driver circuit 120 receives the serial signal and generates a first control signal and a second control signal for respectively controlling the first transistor M1 and the second transistor M2. Therefore, an output current generated by the differential output pair d1 and d2 flows through the transmission lines 150 and the termination resistors Rr1 and Rr2 of the receiver 160 for generating a voltage difference signal across the differential input pair d3 and d4. The receiver 160 obtains an original serial signal according to the voltage difference signal of the differential input pair d3 and d4.

Since the transmitter 100 needs to output the high voltage of 3.3V, electronic devices of the current switch 130 and the current source Is need to be HV devices. For example, the first transistor M1 and the second transistor M2 need to be HV devices. When the first transistor M1 and the second transistor M2 are HV devices, the gate oxide layers thereof are thicker. However, operation speeds of the HV devices are not fast enough, and accordingly a data transmission rate of the conventional transmission apparatus 100 becomes lower than 1 GHz.

Besides the electronic devices of the current switch 130 and the current source Is, partial electronic devices of the pre-driver circuit 120 need to be HV devices. FIG. 2 is a schematic diagram of the conventional pre-driver circuit 120 comprising a level shifter 121 and four inverters 122 to 128. The level shifter 121 comprises a third transistor M3, a fourth transistor M4, a fifth transistor M5, and a sixth transistor M6. The third transistor M3 and the fourth transistor M4 are n-type FETs, and the fifth transistor M5 and the sixth transistor M6 are p-type FETs.

The fifth transistor M5 and the sixth transistor M6 respectively have sources connected to the HV source Vdd1, and gates connected to a drain of the fifth transistor M5. The sixth transistor M6 has a drain as an output end of the level shifter 121. The third transistor M3 and the fourth transistor M4 have drains respectively connected to the drains of the fifth transistor M5 and the sixth transistor M6, sources connected to ground, and gates serving as two input ends of the level shifter 121.

The first inverter 122, serially connected to the second inverter 124, receives the serial signal and has an output end connected to a gate of the fourth transistor M4. The second inverter 124 has an output end connected to a gate of the third transistor M3. FIG. 2 shows an LV source Vdd2 is a voltage source of the first inverter 122 and the second inverter 124, and electronic devices of the first inverter 122 and the second inverter 124 are LV devices. That is, a digital signal generated by the serial signal, the first inverter 122 and the second inverter 124 has a high level of 1.2V and a low level of 0V.

The level shifter 121 receives the digital signal having the high level of 1.2V and the low level of 0V, and outputs a digital signal having a high level of 3.3V and a low level of 0V. A third inverter 126 serially connected to a fourth inverter 128 is connected to the output end of the level shifter 121. FIG. 2 shows an HV source Vdd1 is a voltage source of the level shifter 121, the third inverter 126 and the fourth inverter 128. Therefore, electronic devices of the level shifter 121, the third inverter 126 and the fourth inverter 128 are HV devices, and each of a second control signal and a first control signal generated by the third inverter 126 and the fourth inverter 128 has a high level of 3.3V and a low level of 0V.

As mentioned above, the conventional transmitter comprises a plurality of HV devices that enlarge layout area as well as hinder promotion of the data transmission rate of the transmitter, so as to jeopardize efficiency of the transmitter.

SUMMARY OF THE PRESENT DISCLOSURE

One object of the present disclosure is to provide an LV transmitter with a high output voltage capable of significantly increasing a data transmission rate of the transmitter, for making electronic devices of the transmitter easier to be arranged, and thereby reducing an integrated chip (IC) layout area.

According to an embodiment of the present disclosure, a transmitter comprises a protection circuit; a first termination resistor having a first end coupled to a first voltage source, and a second end coupled to the protection circuit; a second termination resistor having a first end coupled to the first voltage source, and a second end coupled to the protection circuit, wherein the second end of the first termination resistor and the second end of the second termination resistor form a differential output pair; a current switch coupled to the protection circuit; a current source coupled to the current switch; and a pre-driver circuit coupled to the current switch for controlling the current switch, and making the differential output pair generate an output current. Wherein, the pre-driver circuit receives a second voltage source, and the first voltage source is higher than the second voltage source.

BRIEF DESCRIPTION OF THE DRAWINGS

The advantages and spirit related to the present disclosure can be further understood via the following detailed description and drawings.

DETAILED DESCRIPTION OF THE PREFERRED EMBODIMENT

Figure 1:
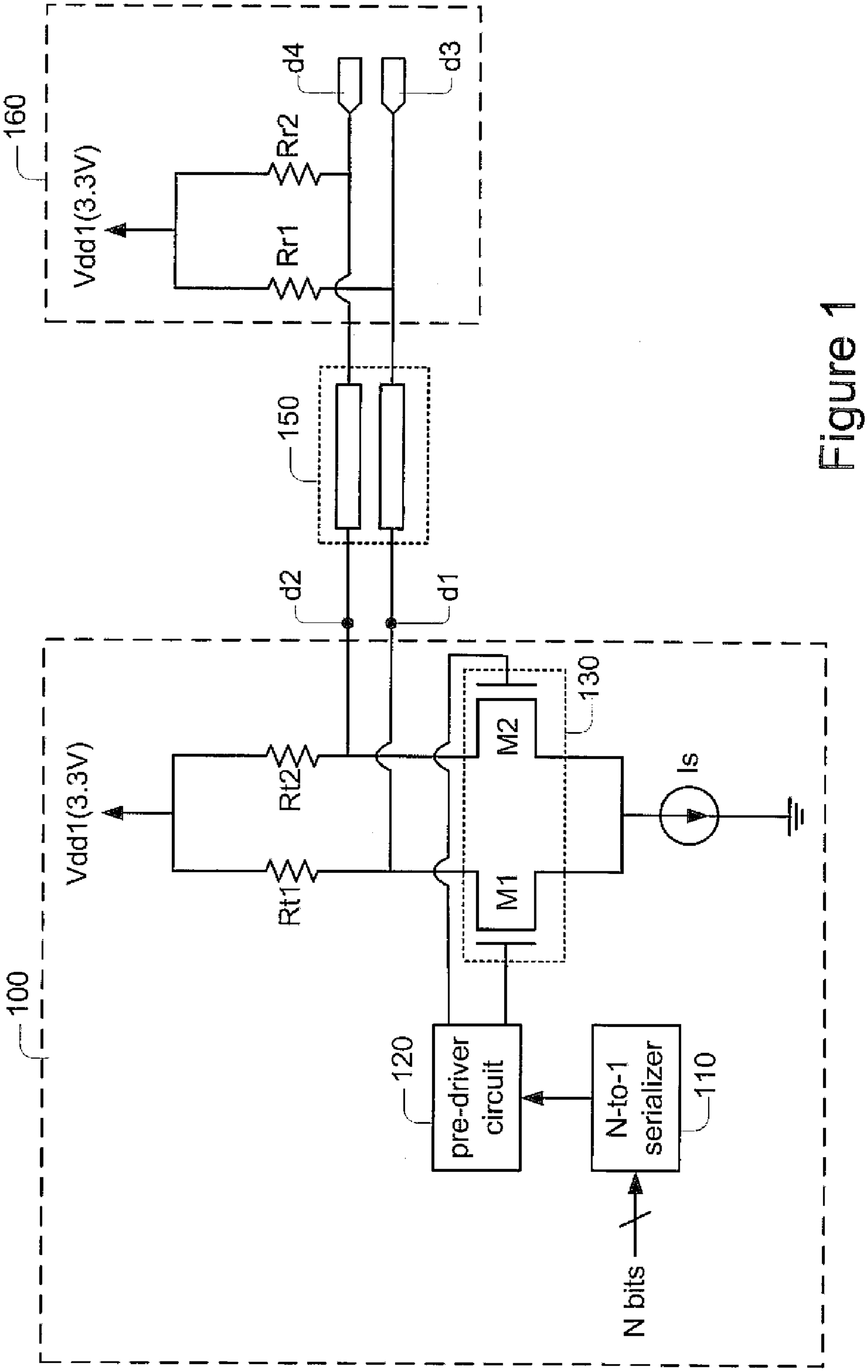
Figure 1 (Prior Art)
FIG. 1 is a schematic diagram of a transmitter and a receiver of the prior art.
Figure 2:
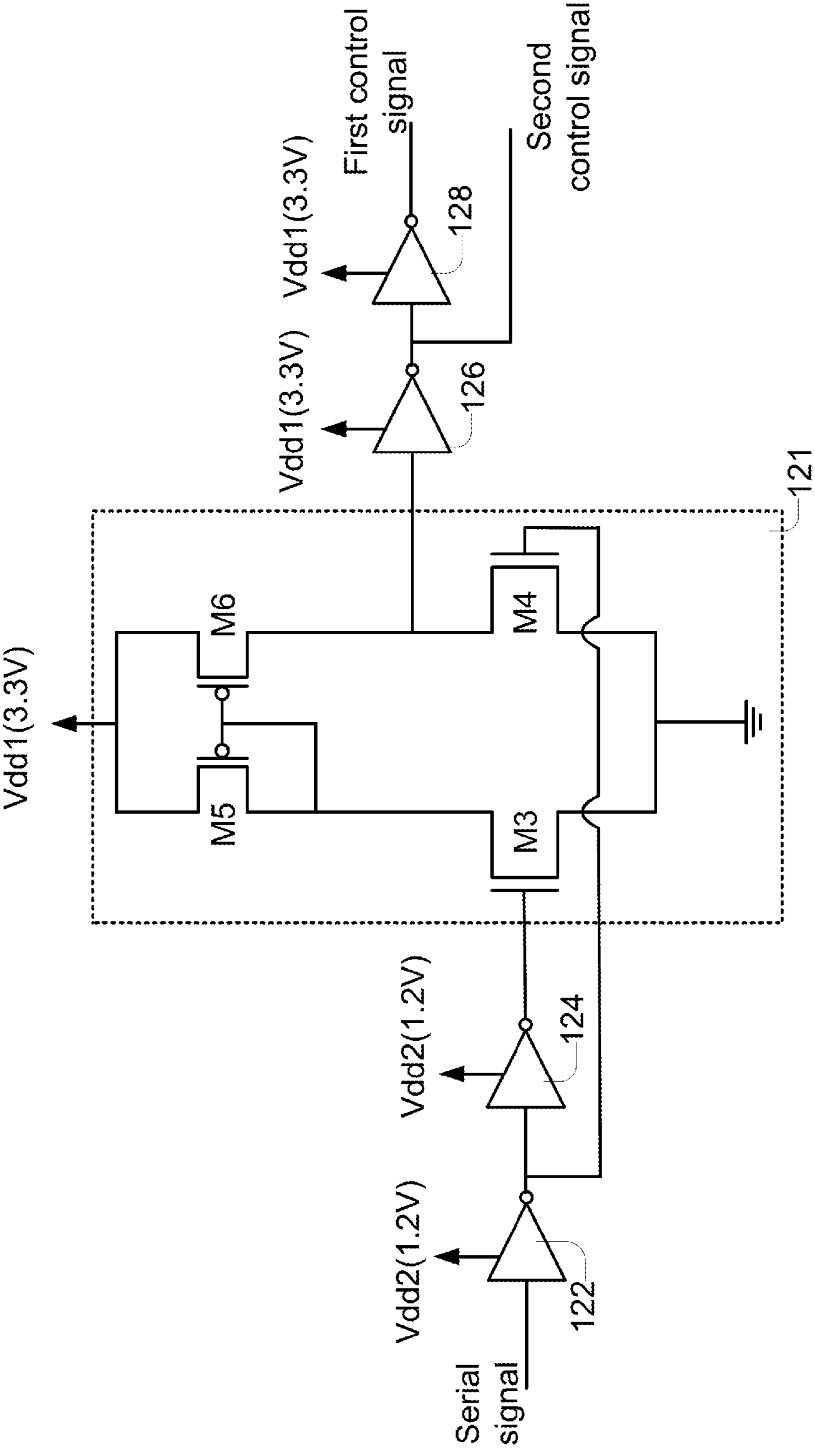
Figure 2 (Prior Art)
FIG. 2 is a schematic diagram of a conventional pre-driver circuit.
Figure 3:
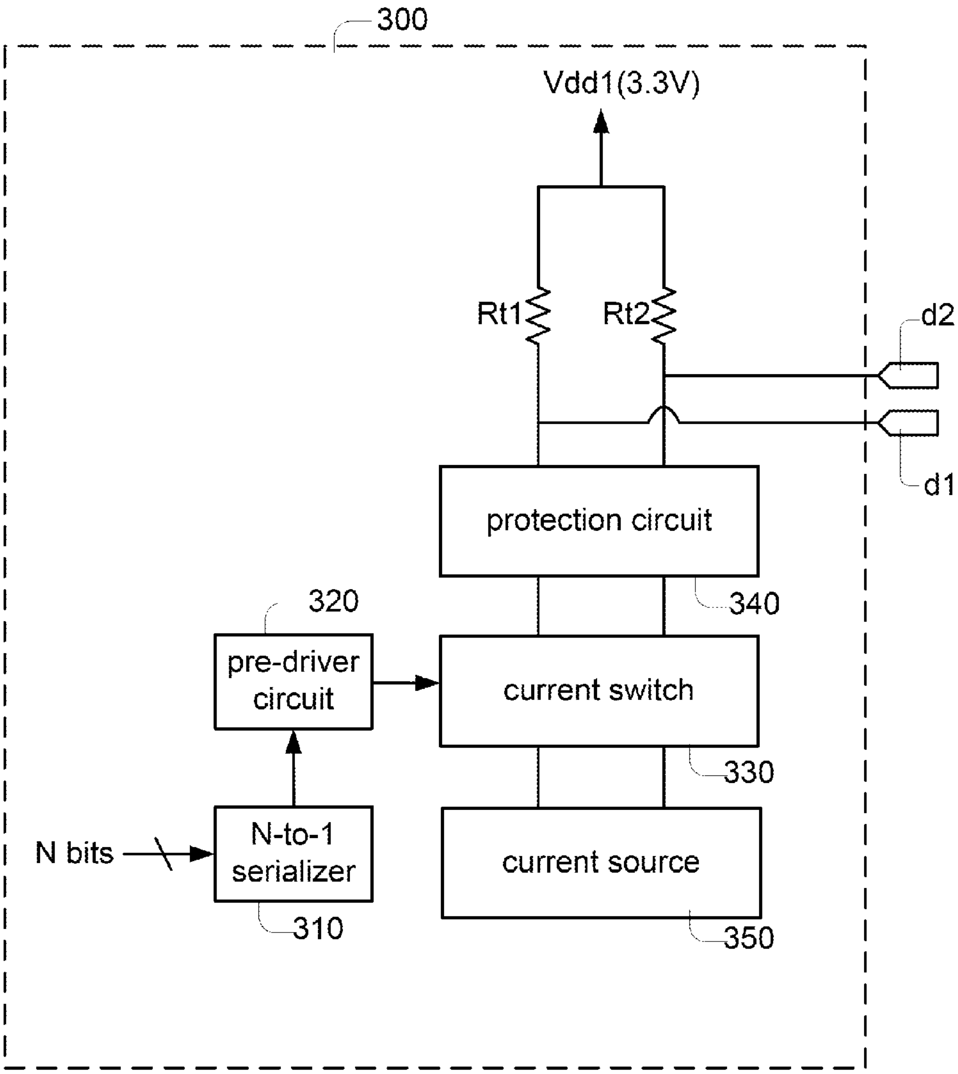
FIG. 3 is a schematic diagram of a transmitter in accordance with an embodiment of the present disclosure.

FIG. 3 is a schematic diagram of a transmitter 300 according to an embodiment of the present disclosure. The transmitter 300 comprises an N-to-1 serializer 310, a pre-driver circuit 320, a current switch 330, a protection circuit 340, a current source 350, and termination resistors Rt1 and Rt2. Preferably, electronic devices of the protection circuit 340 are HV devices, and electronic devices of the N-to-1 serializer 310, the pre-driver circuit 320, the current switch 330 and the current source 350 are formed by LV devices. That is to say, the protection circuit 340, the current switch 330 and the current source 350 are connected in cascade, such that the protection circuit 340 effectively prevents the current switch 330 and the current source 350 from being damaged by impact of an HV source Vdd1. Since the current source 350 is formed by LV devices, electronic devices of the transmitter 300 can easily be arranged to reduce an IC layout area, and at this point a data transmission rate of the transmitter 300 is significantly increased.

Figure 4:
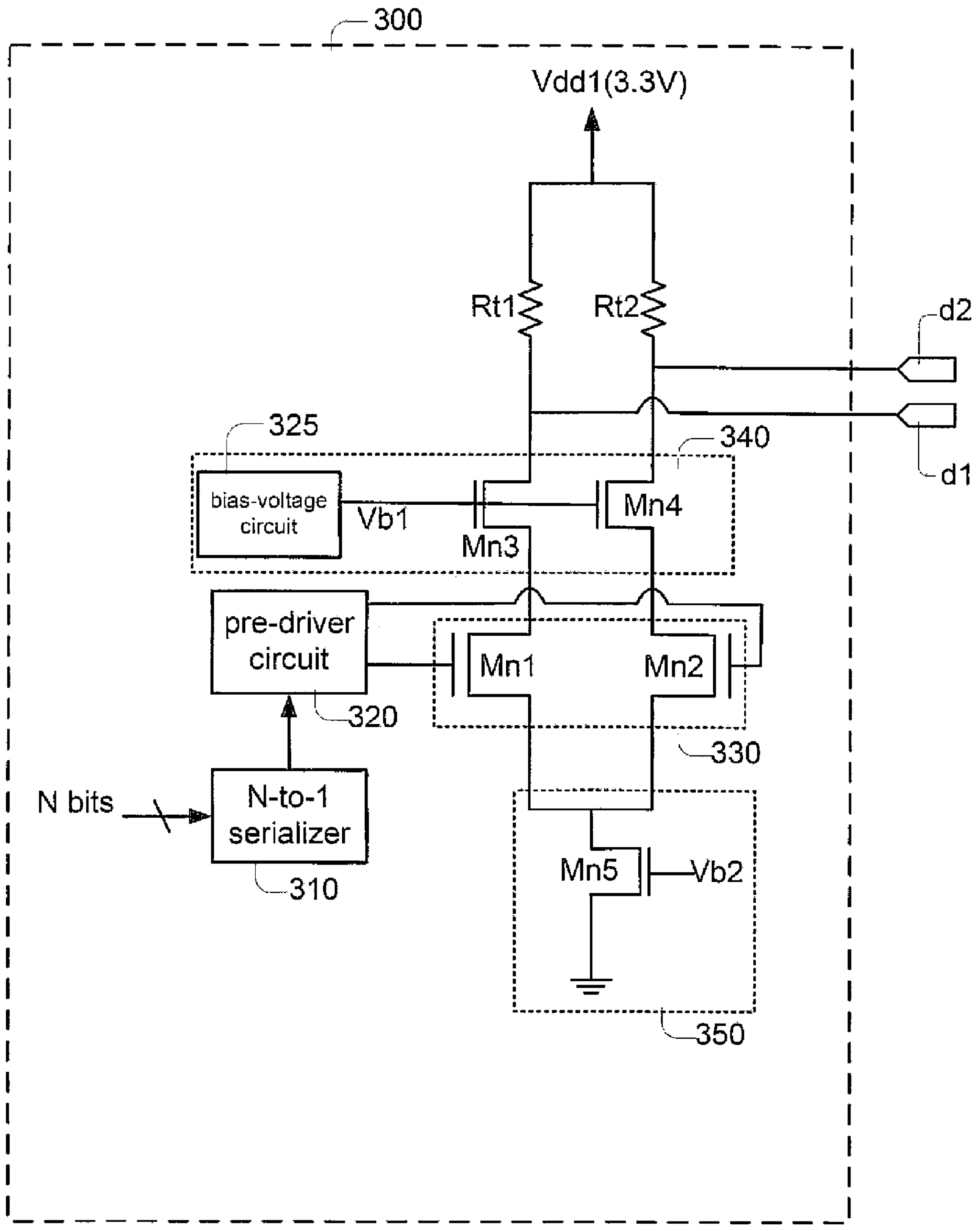
FIG. 4 is a schematic diagram of detailed circuits of a transmitter in accordance with an embodiment of the present disclosure.

FIG. 4 is a schematic diagram of detailed circuits of the transmitter 300 according to an embodiment of the present disclosure. The current switch 330 comprises a first n-type transistor Mn1 and a second n-type transistor Mn2. The protection circuit 340 comprises a bias-voltage circuit 325, a third n-type transistor Mn3, and a fourth n-type transistor Mn4. The current source 350 comprises a fifth n-type transistor Mn5.

One end of the termination resistors Rt1 and Rt2 are connected to the HV source Vdd1, e.g., 3.3V, and the other end of the termination resistors Rt1 and Rt2, nodes d1 and d2 respectively, form a differential output pair. The third n-type transistor Mn3 and the fourth n-type transistor Mn4 have drains respectively connected to the nodes d1 and d2, sources respectively connected to drains of the first n-type transistor Mn1 and the second n-type transistor Mn2, and gates, connected to the bias-voltage circuit 325, for receiving a first bias voltage Vb1.

The first n-type transistor Mn1 and the second n-type transistor Mn2 have sources connected to a drain of the fifth n-type transistor Mn5, which has a source connected to the ground and a gate for receiving a second bias voltage Vb2.

The N-to-1 serializer 310 receives and converts N bits to a serial signal that is received by the pre-driver circuit 320 to generate a first control signal and a second control signal for respectively controlling the first n-type transistor Mn1 and the second n-type transistor Mn2, such that the differential output pair d1 and d2 outputs an output current to transmission lines.

In this embodiment, the bias voltage 325 of the protection circuit 340 provides the first bias voltage Vb1 to the third n-type transistor Mn3 and the fourth n-type transistor Mn4 that are HV devices. Therefore, a voltage falling on the first n-type transistor Mn1 and the second n-type transistor Mn2 of the current switch 330 lies within a bearable range of LV devices, e.g., a voltage of 1.2 times the voltage of the LV source (i.e., 1.44V). In other words when the transmitter 300 is under normal operation, the only concern is that a result of subtracting a threshold voltage Vth of the first n-type transistor Mn1 and the second n-type transistor Mn2 from the first bias voltage Vb1 provided by the bias-voltage circuit 325 needs to be smaller than 1.44V. For example, supposing that the threshold voltage Vth of the first n-type transistor Mn1 and the second n-type transistor Mn2 is 1V, the first bias voltage Vb1 provided by the bias-voltage circuit 325 only needs to be smaller than 2.44V.

Figure 5A:
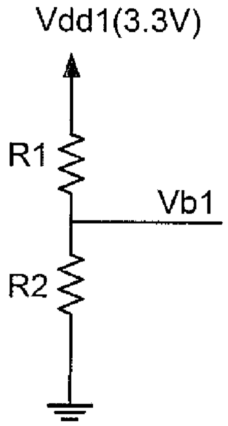
FIGS. 5(A) to FIG. 5(C) are schematic diagrams of a bias-voltage circuit in accordance with an embodiment of the present disclosure.
Figure 5B:
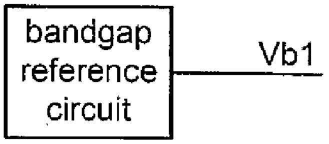

For example, the bias-voltage circuit 325 can be implemented in the following ways. (I) As shown in FIG. 5(A) the bias-voltage circuit 325 is implemented by a resistor divider circuit, i.e., resistance values of a first resistor R1 and a second resistor R2 are controlled to output the fixed first bias voltage Vb1 that is smaller than 2.44V. (II) As illustrated in FIG. 5(B) a fixed voltage outputted by a bandgap reference circuit is used as the first bias voltage Vb1, which is controlled to be smaller than 2.44V. (III) The bias-voltage circuit 325 is implemented by a self replica bias circuit.

Figure 5C:
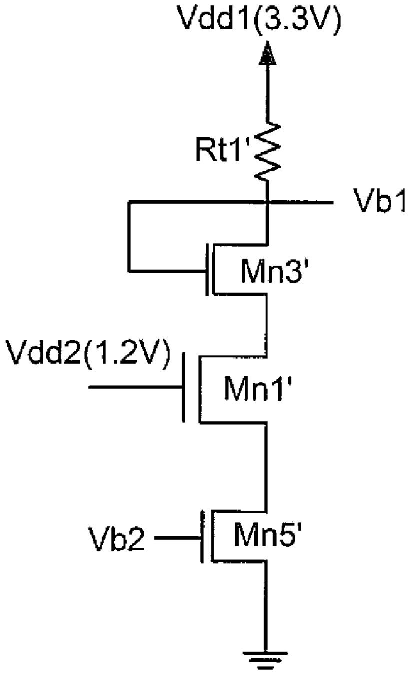

FIG. 5(C) is a schematic diagram of the self replica bias circuit comprising a replica resistor Rt1', a first n-type replica transistor Mn1', a third n-type replica transistor Mn3', and a fifth n-type replica transistor Mn5'. The replica resistor Rt1' is a replica of the termination resistor Rt1, the first n-type replica transistor Mn1' is a replica of the first n-type transistor Mn1, the third n-type replica transistor Mn3' is a replica of the third n-type transistor, and the fifth n-type replica transistor Mn5' is a replica of the fifth n-type transistor Mn5. The replica resistor Rt1' has one end connected to the HV source Vdd1, and the other end, for outputting the first bias voltage Vb1, connected between a drain and a gate of the third n-type replica transistor Mn3'. The first n-type replica transistor Mn1' has a drain connected to a source of the third n-type replica transistor Mn3', a gate connected to an LV source Vdd2, and a drain connected to a drain of the fifth n-type replica transistor Mn5'. The fifth n-type replica transistor Mn5' has a gate connected to the second bias voltage Vb2 and a source connected to ground. Therefore, the first bias voltage generated by the self replica bias circuit in FIG. 5(C) varies dynamically according to a bias voltage of an output apparatus, and the first bias voltage Vb1 is adjusted to be smaller than 2.44V. Since electronic devices of the pre-driver circuit 320 are all LV devices, a level shifter is no longer needed.

Figure 6:
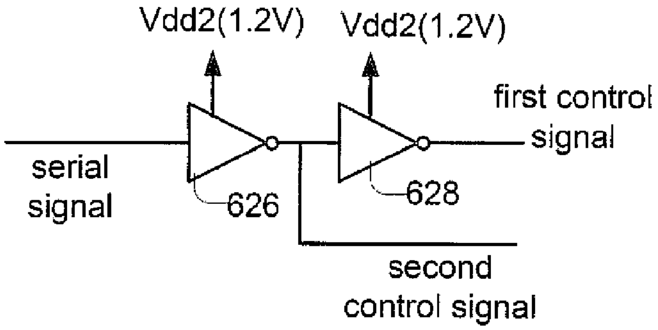
FIG. 6 is a schematic diagram of a pre-driver circuit in accordance with an embodiment of the present disclosure.

FIG. 6 is a schematic diagram of a pre-driver circuit according to an embodiment of the present disclosure. The pre-driver circuit comprises a first inverter 626 and a second inverter 628 connected in series. The first inverter 626 for receiving a serial signal has an output end connected to the gate of the first n-type transistor Mn1, and the second inverter 628 has an output end connected to the gate of the second n-type transistor Mn2. A voltage source of the first inverter 626 and the second inverter 628 is an LV source Vdd2, i.e., a digital signal generated by the serial signal, the first inverter 626 and the second inverter 628 has a high level of 1.2V and a low level of 0V.

One object of the present disclosure is to provide an LV transmitter with a high output voltage capable of significantly increasing a data transmission rate of the transmitter, for making electronic devices of the transmitter easier to be arranged, and thereby reducing an integrated chip (IC) layout area.

While the present disclosure has been described in terms of what is presently considered to be the most practical and preferred embodiments, it is to be understood that the present disclosure need not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A transmitter, comprising:

a protection circuit;

a first termination resistor having a first end coupled to a first voltage source and a second end coupled to the protection circuit;

a second termination resistor having a first end coupled to the first voltage source and a second end coupled to the protection circuit, the second end of the first termination resistor and the second end of the second termination resistor forming a differential output pair;

a current switch coupled to the protection circuit;

a current source coupled to the current switch;

a pre-driver circuit, coupled to the current switch, that controls the current switch such that the differential output pair generates an output current and that receives a second voltage source lower than the first voltage source; and an N-to-1 serializer that receives and converts an N-bit signal to a set of serial signals transmitted to the pre-driver circuit, the pre-driver circuit generating a first control signal and a second control signal to the current switch in response, wherein the current switch comprises:

a first n-type transistor having a gate that receives the first control signal, a drain connected to the protection circuit, and a source connected to the current source; and a second n-type transistor having a gate that receives the second control signal, a drain connected to the protection circuit, and a source connected to the current source, wherein the protection circuit comprises:

a bias voltage circuit that outputs a first bias voltage;

a third n-type transistor having a gate that receives the first bias voltage, a drain connected to the second end of the first termination resistor, and a source connected to the drain of the first n-type transistor; and a fourth n-type transistor having a gate that receives the first bias voltage, a drain connected to the second end of the second termination resistor, and a source connected to drain of the second n-type transistor, wherein the current source comprises a fifth n-type transistor having a gate that receives a second bias voltage, a drain connected to sources of the first n-type transistor and the second n-type transistor, and a source connected to a ground, wherein the bias voltage circuit is a self replica bias circuit comprising:

a replica resistor having a first end connected to the first voltage source, and a second end that outputs the first bias voltage;

a third n-type replica transistor having a drain and a gate both connected to the second end of the replica resistor;

a first n-type replica transistor having a drain connected to a source of the third n-type replica transistor, and a gate connected to the second voltage source; and a fifth n-type replica transistor having a drain connected to a source of the first n-type replica transistor, a gate connected to the second bias voltage, and a source connected to the ground, and wherein the replica resistor is a replica of the first termination resistor, the first n-type replica transistor is a replica of the first n-type transistor, the third n-type replica transistor is a replica of the third n-type transistor, and the fifth n-type replica transistor is a replica of the fifth n-type transistor.

2. The transmitter of claim 1, wherein the first voltage source is substantially 3.3V, and the second voltage source is substantially 1.2V.

3. The transmitter of claim 1, wherein the pre-driver circuit comprises a first inverter and a second inverter connected in series, wherein the first inverter has an input end that receives the serial signal and an output end that outputs the second control signal, and wherein the second inverter has an output end that outputs the first control signal.

4. The transmitter of claim 1, wherein the protection circuit comprises a plurality of high-voltage devices, and wherein the N-to-1 serializer, the pre-driver circuit, the current switch, and the current source comprise a plurality of low-voltage devices.

5. The transmitter of claim 1, wherein the differential output pair is connected to a differential input pair of a receiver and enables the receiver to receive the output current generated by the differential output pair.

6. The transmitter of claim 1, wherein the bias voltage circuit is a bandgap reference circuit that outputs the first bias voltage which is fixed at a predetermined value.

7. The transmitter of claim 1, wherein the bias voltage circuit comprises a first resistor and a second resistor connected in series between the first voltage source and the ground, and wherein the first bias voltage, fixed at a predetermined value, is generated at a node where the first resistor and the second resistor are connected.

* * * * *